United States Patent
Gupta et al.

(10) Patent No.: US 11,227,894 B2
(45) Date of Patent: Jan. 18, 2022

(54) MEMORY CELLS WITH VERTICALLY OVERLAPPING WORDLINES

(71) Applicant: GLOBALFOUNDRIES U.S. Inc., Santa Clara, CA (US)

(72) Inventors: Anuj Gupta, Sunnyvale, CA (US); Bipul C. Paul, Mechanicville, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 162 days.

(21) Appl. No.: 16/668,092

(22) Filed: Oct. 30, 2019

(65) Prior Publication Data

US 2021/0134881 A1    May 6, 2021

(51) Int. Cl.
| | |
|---|---|
| *H01L 29/78* | (2006.01) |
| *H01L 23/522* | (2006.01) |
| *H01L 27/22* | (2006.01) |
| *H01L 23/528* | (2006.01) |
| *H01L 27/24* | (2006.01) |

(52) U.S. Cl.
CPC .......... *H01L 27/228* (2013.01); *H01L 23/528* (2013.01); *H01L 23/5226* (2013.01); *H01L 27/2436* (2013.01); *H01L 29/785* (2013.01)

(58) Field of Classification Search
CPC .......... H01F 10/329; G11C 2211/5615; G11C 11/161; H01L 43/08; H01L 27/228; H01L 23/528; H01L 23/5226; H01L 29/785; H01L 27/2436
See application file for complete search history.

(56) References Cited

U.S. PATENT DOCUMENTS

| | | | |
|---|---|---|---|
| 8,441,850 B2 | 5/2013 | Lee et al. | |
| 9,502,103 B1* | 11/2016 | Tanimoto | ........... G11C 13/0007 |
| 9,768,233 B1* | 9/2017 | Fukuda | ................. H01L 21/311 |
| 10,964,367 B1* | 3/2021 | Jaiswal | ............... G11C 11/1655 |
| 2005/0073880 A1* | 4/2005 | Smith | ..................... G11C 11/16 |
| | | | 365/158 |
| 2012/0299189 A1* | 11/2012 | Nakajima | ......... H01L 21/76897 |
| | | | 257/773 |
| 2013/0009122 A1* | 1/2013 | Park | .................... H01L 27/2409 |
| | | | 257/2 |

(Continued)

OTHER PUBLICATIONS

Li et al., "Design Paradigm for Robust Spin-Torque Transfer Magnetic Ram (STT MRAM) From Circuit/Architecture Perspective," IEEE Transactions on Very Large Scale Integration (VLSI) Systems, vol. 18, No. 12, Dec. 2010, pp. 1710-23.

(Continued)

*Primary Examiner* — Shahed Ahmed
*Assistant Examiner* — Khatib A Rahman
(74) *Attorney, Agent, or Firm* — Yee Tze Lim; Hoffman Warnick LLC

(57) ABSTRACT

One illustrative device includes an array of memory cells including a first row of memory cells and a second row of memory cells adjacent the first row, a first gate structure extending along the first row, a second gate structure extending along the second row, a first wordline positioned in a first layer above the array and contacting the first gate structure, and a second wordline positioned in a second layer above the first layer and contacting the second gate structure, wherein the second wordline vertically overlaps the first wordline.

20 Claims, 6 Drawing Sheets

(56) References Cited

U.S. PATENT DOCUMENTS

| | | | | |
|---|---|---|---|---|
| 2013/0155790 | A1* | 6/2013 | Atsumi | G11C 11/4097 365/189.011 |
| 2015/0179659 | A1* | 6/2015 | Takaki | H01L 27/11548 257/5 |
| 2019/0122984 | A1* | 4/2019 | Kim | G06F 30/392 |
| 2021/0090653 | A1* | 3/2021 | Redondo | G11C 13/0026 |
| 2021/0249601 | A1* | 8/2021 | Lai | G06N 3/04 |

OTHER PUBLICATIONS

Li et al., "Variation-Tolerant Spin-Torque Transfer (STT) MRAM Array for Yield Enhancement," IEEE 2008 Custom Integrated Circuits Conference (CICC), 978-1-4244-2018-6/08, 2008 IEEE, pp. 193-196.

* cited by examiner

MEMORY CELLS WITH VERTICALLY OVERLAPPING WORDLINES

BACKGROUND

Generally, the present disclosure relates to semiconductor devices, and, more specifically, to various novel memory cells with vertical overlapping wordlines.

A resistive memory cell may store information by changing the electrical resistance of a non-volatile memory device, for example, a magnetic tunnel junction (MTJ) element. The MTJ element typically includes a thin insulating tunnel barrier layer sandwiched between a magnetically fixed layer and a magnetically free layer, forming a magnetic tunnel junction. Magnetic orientations of the fixed and free layers may be perpendicular to the growth direction, forming a perpendicular MTJ (or pMTJ) element.

Spin transfer torque (STT), or spin transfer switching, uses spin-aligned ("polarized") electrons to directly apply a torque on the MTJ layers. Specifically, when electrons flowing into a layer have to change spin direction, a torque is developed and is transferred to the nearby layer. The resistance of the MTJ element changes when the spin direction of that layer changes. Other examples of such resistive non-volatile memory devices include memristors (used in ReRAMs) and phase-change (PC) materials (used in PC-RAMs).

Resistive memory cells are typically provided as addressable bit cells in an array of columns and rows. Such an array is provided with corresponding source lines, bit lines and wordlines to perform operations on selected bit cells. Typically, wordlines are formed using polysilicon. Polysilicon has a relatively high resistance and can create a performance bottleneck in the design. One approach to address the performance issue is to provide a metal strap that is connected to the wordline. However this solution decreases cell density.

SUMMARY

The present disclosure is directed to various novel memory cells with vertical overlapping wordlines that may solve or reduce one or more of the problems identified above.

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

One illustrative device includes an array of memory cells including a first row of memory cells and a second row of memory cells adjacent the first row, a first gate structure extending along the first row, a second gate structure extending along the second row, a first wordline positioned in a first layer above the array and contacting the first gate structure, and a second wordline positioned in a second layer above the first layer and contacting the second gate structure, wherein the second wordline vertically overlaps the first wordline.

Another illustrative device includes an array of memory cells including a first row of memory cells and a second row of memory cells adjacent the first row, each memory cell comprising an access transistor and a storage element coupled to the access transistor, a first shared gate structure extending along access transistors of the memory cells in the first row, and a second shared gate structure extending along access transistors of the memory cells in the second row. The illustrative device also includes first gate contacts contacting the first gate structure at positions along an axial length of the first gate structure, wherein each memory cell in the first row of memory cells has an associated first gate contact, and second gate contacts contacting the second gate structure at positions along an axial length of the second gate structure, wherein each memory cell in the second row of memory cells has an associated second gate contact. The illustrative device further includes a first wordline positioned in a first layer above the array and contacting the first gate contacts and a second wordline positioned in a second layer above the first layer and contacting the second gate contacts, wherein the first wordline comprises a first line portion, and the second wordline comprises a second line portion that vertically overlaps the first line portion.

Yet another illustrative device includes a first memory cell comprising a first access transistor, a second memory cell comprising a second access transistor, wherein the first and second access transistors have a first shared gate structure and are positioned in a first row, a third memory cell comprising a third access transistor, a fourth memory cell comprising a fourth access transistor, wherein the third and fourth access transistors have a second shared gate structure and are positioned in a second row adjacent the first row. The illustrative device further includes a source/drain region of the first access transistor coupled to a source/drain region of the third access transistor and a source/drain region of the second access transistor coupled to a source/drain region of the fourth access transistor, a first wordline positioned in a first layer and contacting the first gate structure, and a second wordline positioned in a second layer above the first layer and contacting the second gate structure, wherein the second wordline vertically overlaps the first wordline.

BRIEF DESCRIPTION OF THE DRAWINGS

The disclosure may be understood by reference to the following description taken in conjunction with the accompanying drawings, in which like reference numerals identify like elements, and in which.

Figure 1:
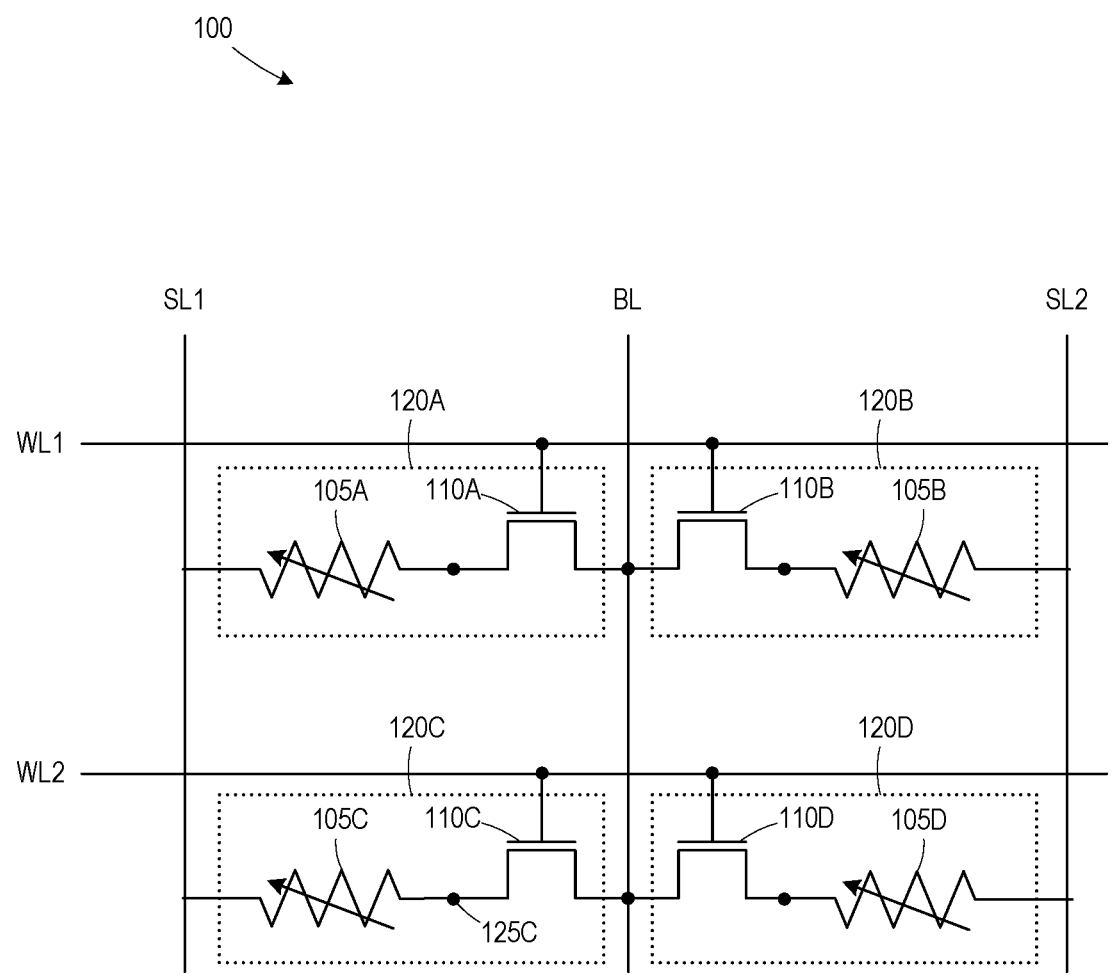
FIG. 1 is a circuit diagram of a resistive memory device, according to some embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase. As will be readily apparent to those skilled in the art upon a complete reading of the present application, the methods disclosed herein may be employed in manufacturing a variety of different devices, including, but not limited to, logic devices, memory devices, etc., and the devices may be may be either NMOS or PMOS devices.

As will be appreciated by those skilled in the art after a complete reading of the present application, various doped regions, e.g., halo implant regions, well regions and the like, are not depicted in the attached drawings. Of course, the inventions disclosed herein should not be considered to be limited to the illustrative examples depicted and described herein. The various components and structures of the integrated circuit devices disclosed herein may be formed using a variety of different materials and by performing a variety of known techniques, e.g., a chemical vapor deposition (CVD) process, an atomic layer deposition (ALD) process, a thermal growth process, spin-coating techniques, etc. The thicknesses of these various layers of material may also vary depending upon the particular application. With reference to the attached figures, various illustrative embodiments of the methods and devices disclosed herein will now be described in more detail.

FIG. 1 is a circuit diagram of a memory array 100, according to some embodiments described herein. The memory array 100 includes resistive storage elements 105A-105D and access transistors 110A-110D arranged in cells 120A-120D. The access transistors 110A-110D are coupled to a shared bit line (BL). A wordline WL1 is coupled to the gates of the access transistors 110A, 110B, and a wordline WL2 is coupled to the gates of the access transistors 110C, 110D. The resistive storage elements 105A, 105C are coupled to a source line SL1, and the resistive storage elements 105B, 105D are coupled to a source line SL2.

In some embodiments, the resistive storage elements 105A-105D are spin-transfer torque magnetic random access memory (STT-MRAM) devices. An STT-MRAM element includes a reference layer and a free layer separated by a barrier layer. A magnetic field of the reference layer is fixed. A magnetic field of the free layer is modulated to define the state of the memory element. The STT-MRAM element has a parallel, or low resistance, state when the magnetic fields of the reference layer and the free layer are aligned, and an anti-parallel, or high resistance, state when the magnetic fields of the reference layer and the free layer are opposite one another. In some embodiments, the access transistors 110A-110D are metal oxide semiconductor (MOS) transistors, such as an N-type MOS transistor, and each includes a gate or control terminal, a first source/drain (S/D) terminal, and a second source/drain (S/D) terminal. In some embodiments, the access transistors 110A-110D are formed as finFET devices, gate-all-around (GAA) devices, or other suitable structures, as described in the following examples. In some embodiments, the access transistors 110A-110D are planar devices.

Figure 2:
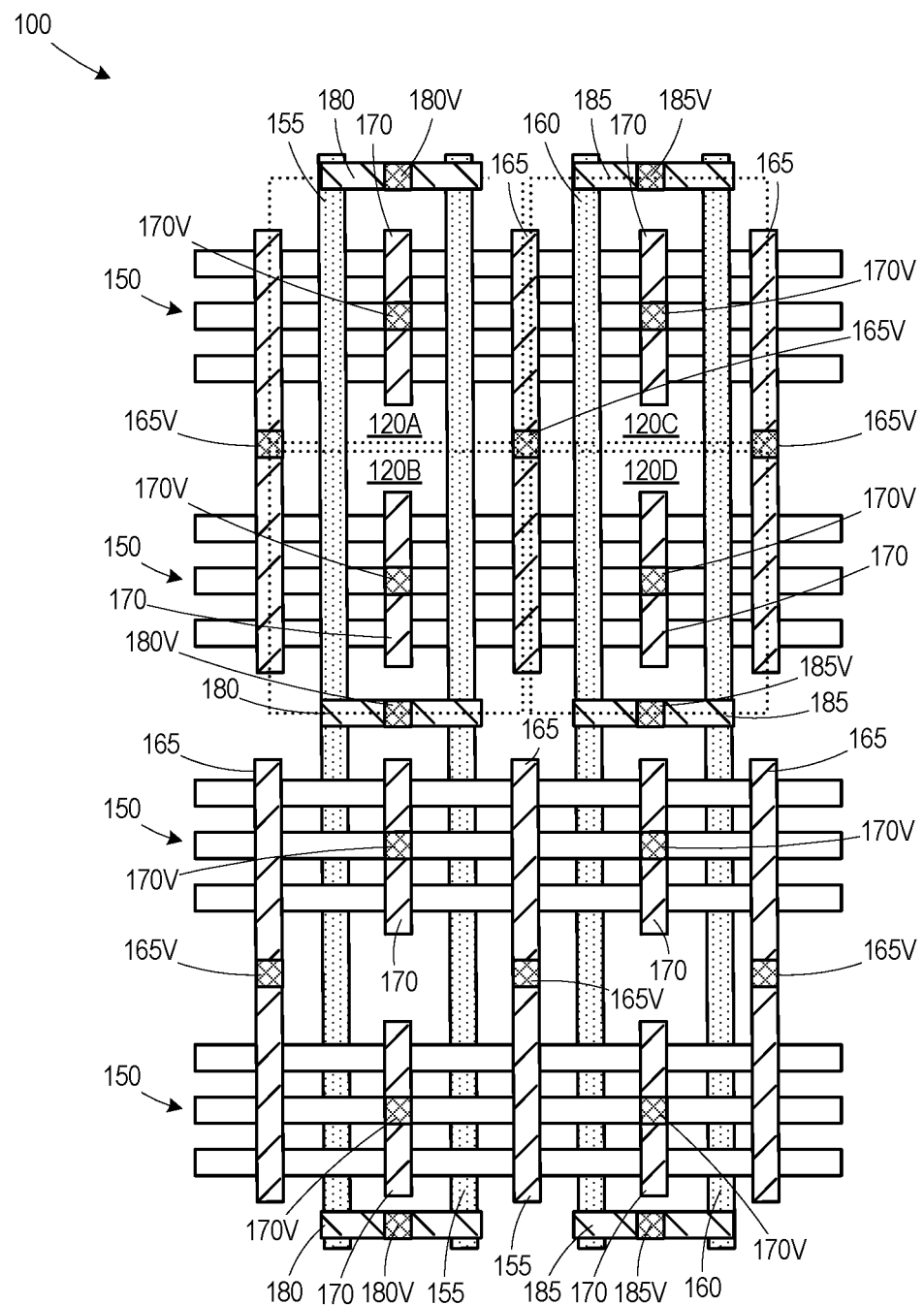
FIGS. 2-6 are layout diagrams of a resistive memory device, according to some embodiments.

FIG. 2 is a layout diagram of the memory array 100 of FIG. 1, according to some embodiments. Multiple layers are illustrated in FIG. 2, such as a logic level for implementing the transistors 110A-110D, and one or more metallization layers for implementing contacts and metal lines. For ease of illustration, not all features of an actual device are illustrated. For example, dielectric layers are typically provided between the layers and various conductive interconnect structures are provided to connect devices in different levels. The cells 120A-120D illustrated in FIG. 1 are shown in FIG. 2 along with other cells in an array including horizontal columns and verticals rows. In the example illustrated in FIG. 2, vertically adjacent cells share common gate structures and horizontally adjacent cells share the same source line.

Referring to FIG. 2, the transistors 110A-110D are finFET devices including fins 150. Gate structures 155, 160 are formed over channel portions of the fins 150. The gate structures 155 are associated with the access transistors 110A, 110B, and the gate structures 160 are associated with the access transistors 110C, 110D. In some embodiments, the gate structures 155, 160 are polysilicon. Source/drain contacts 165 couple source/drain regions of the fins 150 in adjacent cell pairs 120A/120B, 120C/120D that share a common source line. Source/drain contacts 170 contact the source/drain regions on the fins 150 where the resistive storage elements 105A-105D are formed in higher layers. Gate contacts 180 couple the gate structures 155, and gate contacts 185 couple the gate structures 160. Source/drain vias 165V, 170V contact the source/drain contacts 165, 170, and gate vias 180V, 185V contact the gate contacts 180, 185 in the layer above the respective contacts.

Figure 3:
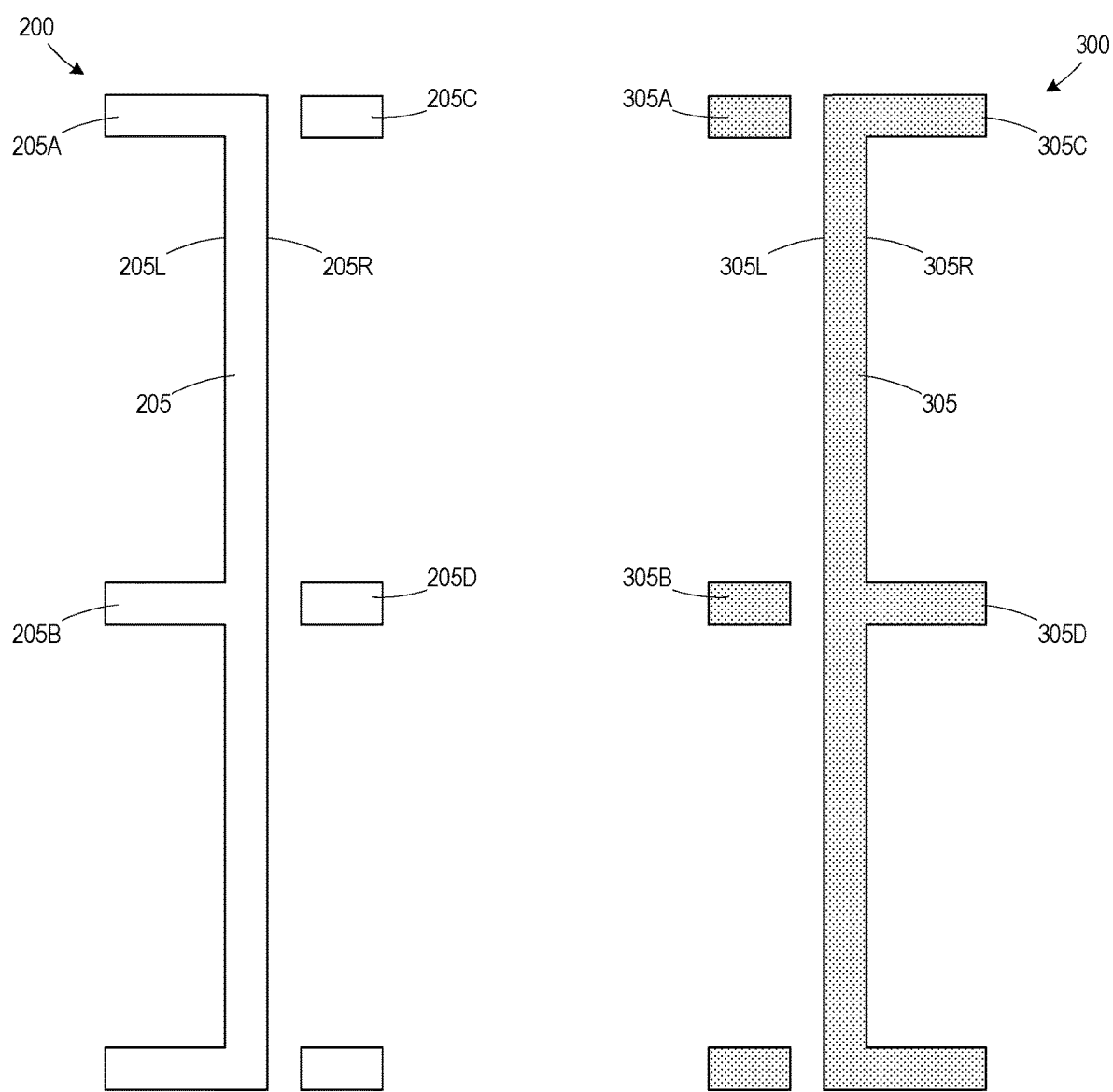

FIG. 3 is a layout diagram of wordlines 200, 300 that are formed over the structure shown in FIG. 2, according to some embodiments. The wordline 200 is formed in a metallization layer above the vias 180V, 185V, and the wordline 300 is formed in a metallization layer above the wordline 200. In FIG. 3, the wordlines 200, 300 are shown side by side, but in the device 100, the wordline 300 is directly over the wordline 200 such that they overlap. In some embodiments, the wordlines 200, 300 are mirror images of each other. The wordline 200 includes a line portion 205 and finger portions 205A, 205B extending from a first side 205L of the line portion 205. Island portions 205C, 205D are positioned adjacent a second side 205R of the line portion 205 horizontally aligned with the finger portions 205A, 205B. Similarly, but reversed, the wordline 300 includes a line portion 305 and finger portions 305C, 305D extending from a first side 305R of the line portion 305. Island portions 305A, 305B are positioned adjacent a second side 305L of the line portion 305 aligned with the finger portions 305C, 305D. The island portions 205C, 205D are vertically aligned with and in conductive contact with the finger portions 305C, 305D, and the island portions 305A, 305B are vertically aligned with and in conductive contact with the finger portions 205A, 205B. The line portion 305 vertically overlaps the line portion 205. The line portions 205, 305 are parallel and have axial lengths that extend along the array in a row direction.

Figure 4:
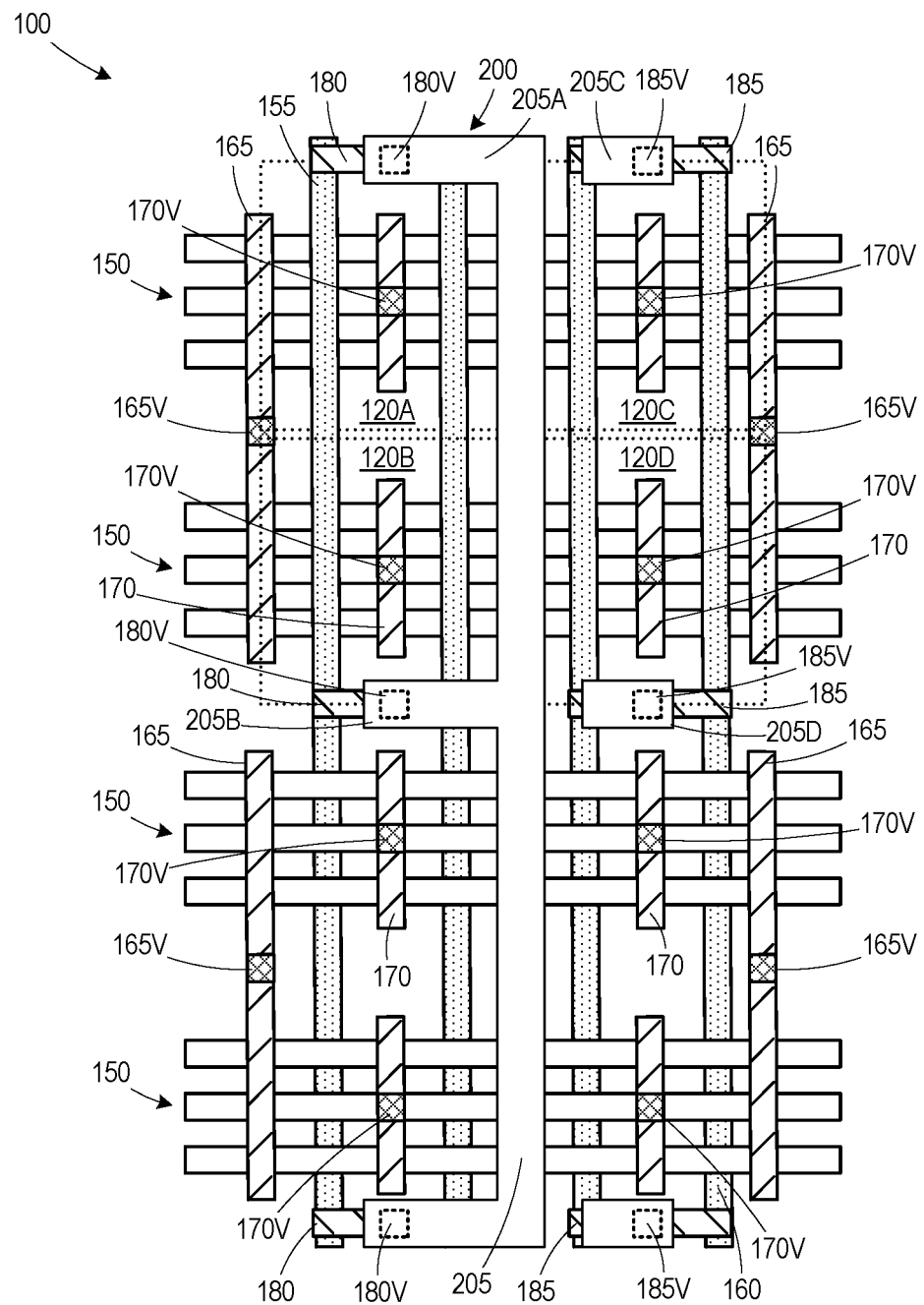

FIG. 4 is a layout diagram of the memory array 100 of FIG. 2 illustrating the wordline 200 positioned over the cells 120A-120D. The finger portions 205A, 205B contact the gate vias 180V associated with the cells 120A, 120B, respectively. The island portions 205C, 205D contact the gate vias 180V associated with the cells 120C, 120D, respectively.

Figure 5:
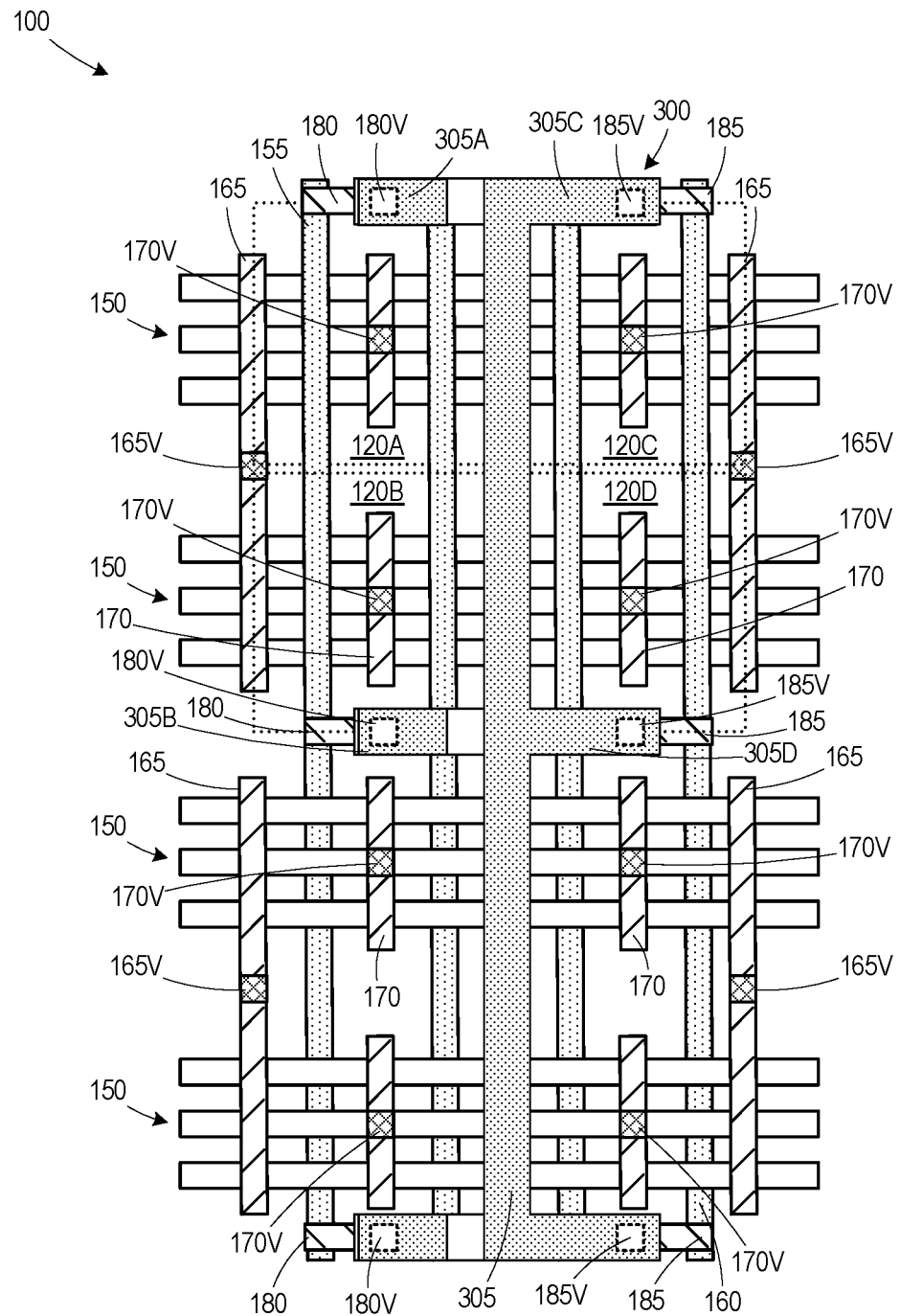

FIG. 5 is a layout diagram of the resistive memory device 100 of FIG. 4 illustrating the wordline 300 positioned over the cells 120A-120D, according to some embodiments. The finger portions 305C, 305D contact the island portions 205C, 205D that contact the gate vias 180V associated with the cells 120C, 120D, respectively. The island portions 305A, 305B contact the finger portions 205A, 205B that contact the gate vias 180V associated with the cells 120A, 120B, respectively. The island portions 305A, 305B provide contact points for contacting the wordline 200 in the same metallization layer as the wordline 300. In some embodiments, the island portions 305A, 305B are omitted.

Figure 6:
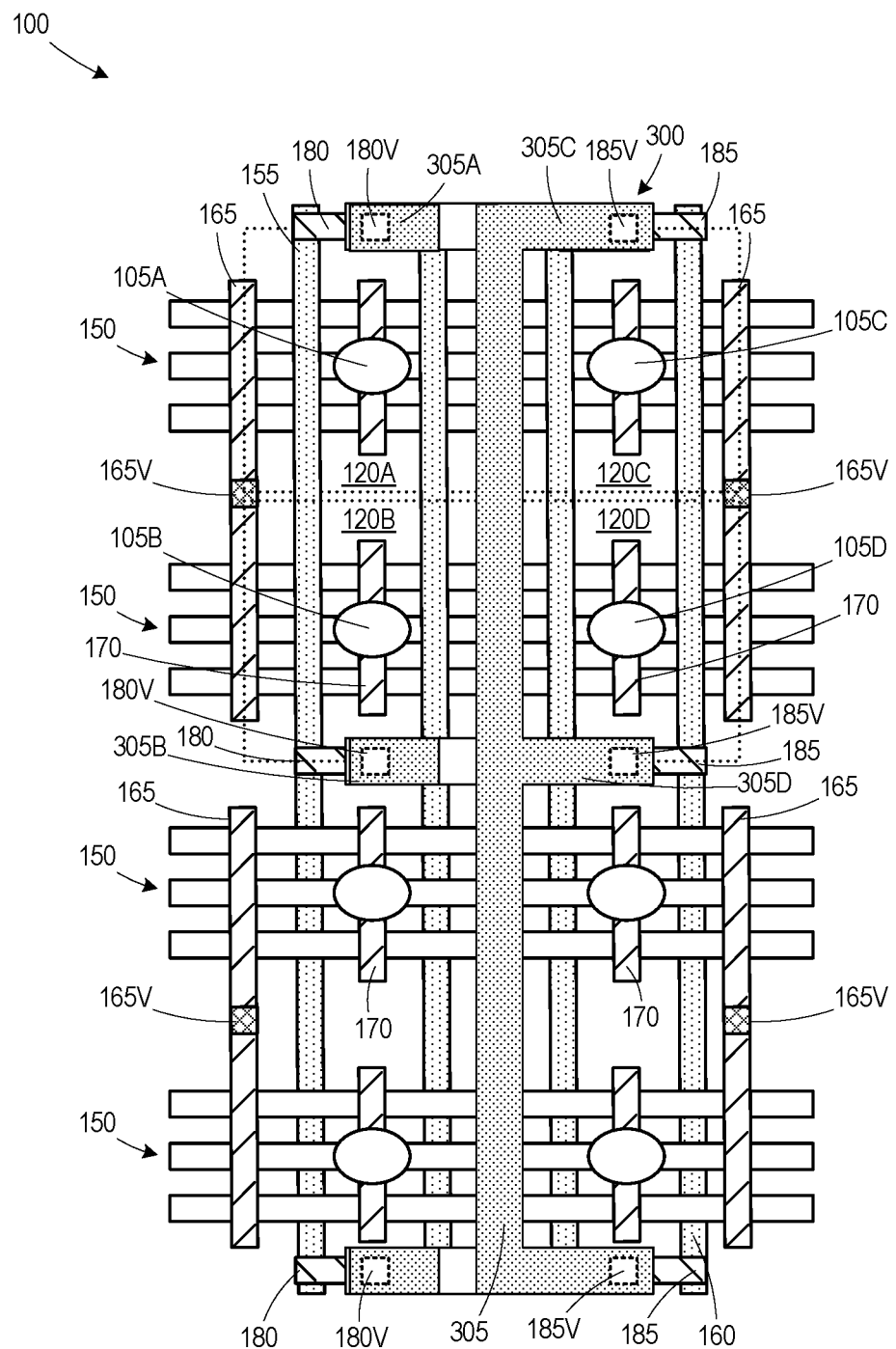

FIG. 6 is a layout diagram of the memory array 100 of FIG. 5 illustrating the resistive storage elements 105A-105D formed in layers above those in which the wordlines 200, 300 are positioned. Lower terminals of the resistive storage elements 105A-105D contact the respective source/drain regions 170 through the source/drain vias 170V. The bit line of FIG. 1 is implemented by conductive lines in a metallization layer above the resistive storage elements 105A-105D.

The memory array 100 described herein has numerous advantages. In general, cells in one row (e.g., cells 120A, 120B) are connected to a first wordline 200 in one metallization layer, and cells in an adjacent row (e.g., cells 120C, 120D) are connected to a second wordline 300 provided in a metallization layer over the wordline 200. Because the wordlines 200, 300 are formed above each other, the wordlines 200, 300 occupy the same area in the horizontal footprint of the device 100. The presence of multiple connections to the wordlines 200, 300 along the axial length of the gate structures 155, 160 obviates the need for any strapping structures. Providing multiple wordlines 200, 300 without requiring strapping structures reduces the cell footprint, thereby increasing device density.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Note that the use of terms, such as "first," "second," "third" or "fourth" to describe various processes or structures in this specification and in the attached claims is only used as a shorthand reference to such steps/structures and does not necessarily imply that such steps/structures are performed/formed in that ordered sequence. Of course, depending upon the exact claim language, an ordered sequence of such processes may or may not be required. As used herein, spatial references "top," "bottom," "upper," "lower," "vertical," "horizontal" and the like may be used for convenience when referring to structures of FET devices. These references are intended to be used in a manner consistent with the drawings only for teaching purposes, and are not intended as absolute references for FET structures. For example, FETs may be oriented spatially in any manner different from the orientations shown in the drawings. Accordingly, the protection sought herein is as set forth in the claims below.

The invention claimed is:

1. A device comprising:
   an array of memory cells including a first row of memory cells and a second row of memory cells adjacent the first row;
   a first gate structure extending along the first row;
   a second gate structure extending along the second row;
   a first wordline positioned in a first layer above the array and coupled to the first gate structure;
   a second wordline positioned in a second layer above the first layer and contacting the second gate structure, wherein the first wordline comprises a first line portion and a first finger portion extending from the first line portion in a first direction, the second wordline comprises a second line portion and a second finger portion extending from the second line portion in a second direction opposite the first direction, and wherein the second line portion vertically overlaps the first line portion;
   a first gate contact coupled to the first gate structure;
   a first gate via positioned above and coupled to the first gate contact, wherein the first finger portion is coupled to the first gate via;
   a second gate contact coupled to the second gate structure; and
   a second gate via positioned above and coupled to the first gate contact, wherein the second finger portion is coupled to the second gate via.

2. The device of claim 1, wherein each memory cell in the first row of memory cells comprises a connection between the first gate structure and the first wordline, and each memory cell in the second row of memory cells comprises a connection between the second gate structure and the second wordline.

3. The device of claim 1, wherein the first line portion and the second line portions extend axially in a direction in parallel with a row direction of the array.

4. The device of claim 1, wherein the first wordline comprises a first island portions coupled to the second gate via and the second finger portion.

5. The device of claim 1, wherein the second wordline comprises a second island portion coupled to the first finger portion.

6. A device, comprising:
   an array of memory cells including a first row of memory cells and a second row of memory cells adjacent the first row, each memory cell in the first row of memory cells and the second row of memory cells comprising an access transistor and a storage element coupled to the access transistor;
   a first gate structure extending along access transistors of the memory cells in the first row;
   a second gate structure extending along access transistors of the memory cells in the second row;
   first gate contacts coupled to the first gate structure at positions along an axial length of the first gate structure, wherein each memory cell in the first row of memory cells has an associated first gate contact;

second gate contacts coupled to the second gate structure at positions along an axial length of the second gate structure, wherein each memory cell in the second row of memory cells has an associated second gate contact;

a first wordline positioned in a first layer above the array and coupled to the first gate contacts;

a second wordline positioned in a second layer above the first layer and coupled to the second gate contacts, wherein the first wordline comprises a first line portion and first finger portions extending from the first line portion in a first direction and coupled to the first gate contacts, and the second wordline comprises a second line portion and second finger portions extending from the second line portion in a second direction opposite the first direction and coupled to the second gate contacts, and wherein the second line portion vertically overlaps the first line portion;

first gate vias positioned above and coupled to the first gate contacts, wherein the first finger portions is coupled to the first gate vias; and second gate vias positioned above and coupled to the second gate contacts, wherein the second finger portions is coupled to the second gate vias.

7. The device of claim 6, wherein the first line portion and the second line portions have axial lengths parallel to the axial lengths of the first and second gate structures.

8. The device of claim 6, wherein the first wordline comprises first island portions coupled to the second gate vias and the second finger portions.

9. The device of claim 6, wherein the second wordline comprises second island portions coupled to the first finger portions.

10. The device of claim 6, wherein the storage element of each memory cell comprises a resistive storage element.

11. A device, comprising:
a first memory cell comprising a first access transistor;
a second memory cell comprising a second access transistor, wherein the first access transistor and the second access transistors have a first shared gate structure and are positioned in a first row;
a third memory cell comprising a third access transistor;
a fourth memory cell comprising a fourth access transistor, wherein the third access transistor and the fourth access transistors have a second shared gate structure and are positioned in a second row adjacent the first row, and wherein a source/drain region of the first access transistor is coupled to a source/drain region of the third access transistor, and a source/drain region of the second access transistor is coupled to a source/drain region of the fourth access transistor;

a first wordline positioned in a first layer and coupled to the first shared gate structure;

a second wordline positioned in a second layer above the first layer and coupled to the second shared gate structure, wherein the first wordline comprises a first line portion and a first finger portion extending from the first line portion in a first direction, the second wordline comprises a second line portion and a second finger portion extending from the second line portion in a second direction opposite the first direction, and wherein the second line portion vertically overlaps the first line portion;

a first gate contact coupled to the first shared gate structure;

a first gate via positioned above and coupled to the first gate contact, wherein the first finger portion is coupled to the first gate via;

a second gate contact coupled to the second shared gate structure; and a second gate via positioned above and coupled to the first gate contact, wherein the second finger portion is coupled to the second gate via.

12. The device of claim 11, wherein the first line portion and the second line portion have axial lengths extending in a direction across the first memory cell and the second memory cell.

13. The device of claim 11, wherein the first wordline comprises a first island portion coupled to the second gate vias and the second finger portion.

14. The device of claim 11, wherein the second wordline comprises a second island portions coupled to the first finger portion.

15. The device of claim 6, wherein each memory cell in the first row of memory cells couples the first gate structure to the first wordline.

16. The device of claim 6, wherein each memory cell in the second row of memory couples the second gate structure to the second wordline.

17. The device of claim 6, wherein the first line portion and the second line portion extend axially in a direction in parallel with a row direction of the array.

18. The device of claim 11, wherein each memory cell in the first row of memory cells couples the first gate structure to the first wordline.

19. The device of claim 11, wherein each memory cell in the second row of memory cells couples the second gate structure to the second wordline.

20. The device of claim 11, wherein the first line portion and the second line portion extend axially in a direction in parallel with a row direction of the array.

* * * * *